United States Patent
Peng et al.

(10) Patent No.: US 10,340,023 B1
(45) Date of Patent: Jul. 2, 2019

(54) METHOD AND SYSTEM FOR DETERMINING BIT VALUES IN NON-VOLATILE MEMORY

(71) Applicant: Storart Technology Co., Ltd., Hsinchu (TW)

(72) Inventors: Hsiang-En Peng, New Taipei (TW); Sheng-Wei Yuan, Hsinchu (TW); Hou-Yun Lee, Hsinchu (TW)

(73) Assignee: Storart Technology Co., Ltd, Hsinchu (TW)

( * ) Notice: Subject to any disclaimer, the term of this patent is extended or adjusted under 35 U.S.C. 154(b) by 0 days.

(21) Appl. No.: 15/923,247

(22) Filed: Mar. 16, 2018

(30) Foreign Application Priority Data

Mar. 6, 2018 (TW) .............................. 107107412 A (51) Int. Cl.
| | | |
|---|---|---|
| *G11C 11/34* | (2006.01) | |
| *G11C 16/06* | (2006.01) | |
| *G11C 29/50* | (2006.01) | |
| *G11C 16/26* | (2006.01) | |
| *G11C 29/42* | (2006.01) | |

(52) U.S. Cl.
CPC ........ *G11C 29/50004* (2013.01); *G11C 16/26* (2013.01); *G11C 29/42* (2013.01); *G11C 2029/5004* (2013.01)

(58) Field of Classification Search
CPC ... G11C 29/50004; G11C 16/26; G11C 29/42; G11C 2029/5004
See application file for complete search history.

(56) References Cited

U.S. PATENT DOCUMENTS

| | | | | |
|---|---|---|---|---|
| 8,514,646 | B1* | 8/2013 | Nan .................... | G11C 11/5642 365/185.02 |
| 2011/0085386 | A1* | 4/2011 | Chou ................ | G11C 16/0475 365/185.24 |
| 2013/0223155 | A1* | 8/2013 | Oowada ............. | G11C 11/5642 365/185.22 |
| 2017/0025180 | A1* | 1/2017 | Sanasi ................... | G11C 16/26 |

\* cited by examiner

*Primary Examiner* — Toan K Le
(74) *Attorney, Agent, or Firm* — Jackson IPG PLLC; Demian K. Jackson (57) ABSTRACT

A method and a system for determining bit values in a non-volatile memory having a number of cells each for storing a bit value are disclosed. The method includes the steps of: a) providing a first test sensing voltage to the cells and calculating a cell count; b) providing another test sensing voltage to the cells and calculating a difference of the cell counts between this step and previous step; c) providing still another test sensing voltage and calculating another difference of the cell counts between this step and previous step; d) processing step c) for N times; e) calculating differential amounts of cell counts and assigning an index number to each group of cells; f) choosing a voltage as an updated sensing voltage.

20 Claims, 6 Drawing Sheets

METHOD AND SYSTEM FOR DETERMINING BIT VALUES IN NON-VOLATILE MEMORY

FIELD OF THE INVENTION

The present invention relates to a method and a system for determining bit values in a non-volatile memory. More particularly, the present invention relates to a method and a system for determining bit values in a non-volatile memory by a number of sensing voltages so that the bit values contain soft-decision data.

BACKGROUND OF THE INVENTION

Non-volatile memory, such as hard disk drive, EEPROM or flash memory, is the most popular hardware to store data without power supply for a certain period of time. Especially, flash memory is widely used in portable devices and makes our daily life convenient. We can see it in a laptop computer, a smartphone, or even a multifunction electronic watch. There are two major categories of flash memories, NAND flash and NOR flash. Although performances of these flash memories are different, the fundament for keeping information, namely, bits of logic 0 or logic 1, is the same. The flash memory stores the information in an array of memory cells consisting of floating gate transistors or charge trap transistors (cells). Physically, there are a number of electronics injected into and kept by a floating gate or charge trap layer of each cell. When the information needs to be read out, a sensing voltage should be applied to a control gate of the cell. If a threshold voltage for the cell is lower than the sensing voltage, the data stored in that cell is logic 1; otherwise, it is logic 0.

The above description is about operation of one cell. In a flash memory, there may be hundreds of thousands of cells arranged in pages of a couple of blocks. Due to difference from manufacturing processes and use situation, threshold voltage for each cell may not be the same. In other words, when one sensing voltage is applied to all cells, one cell having a bit of logic 0 may be recognized as logic 1, vice versa. On the other hand, in order to make sure if the bit is correctly stored, i.e. it is not flipped, an ECC (Error Correcting Code) would be required to examine the information or pieces of the information before the information is further transmitted out. Soft-decision data should be available after the read operation. Therefore, techniques for fetching those soft-decision data of stored bits are required.

Figure 1:
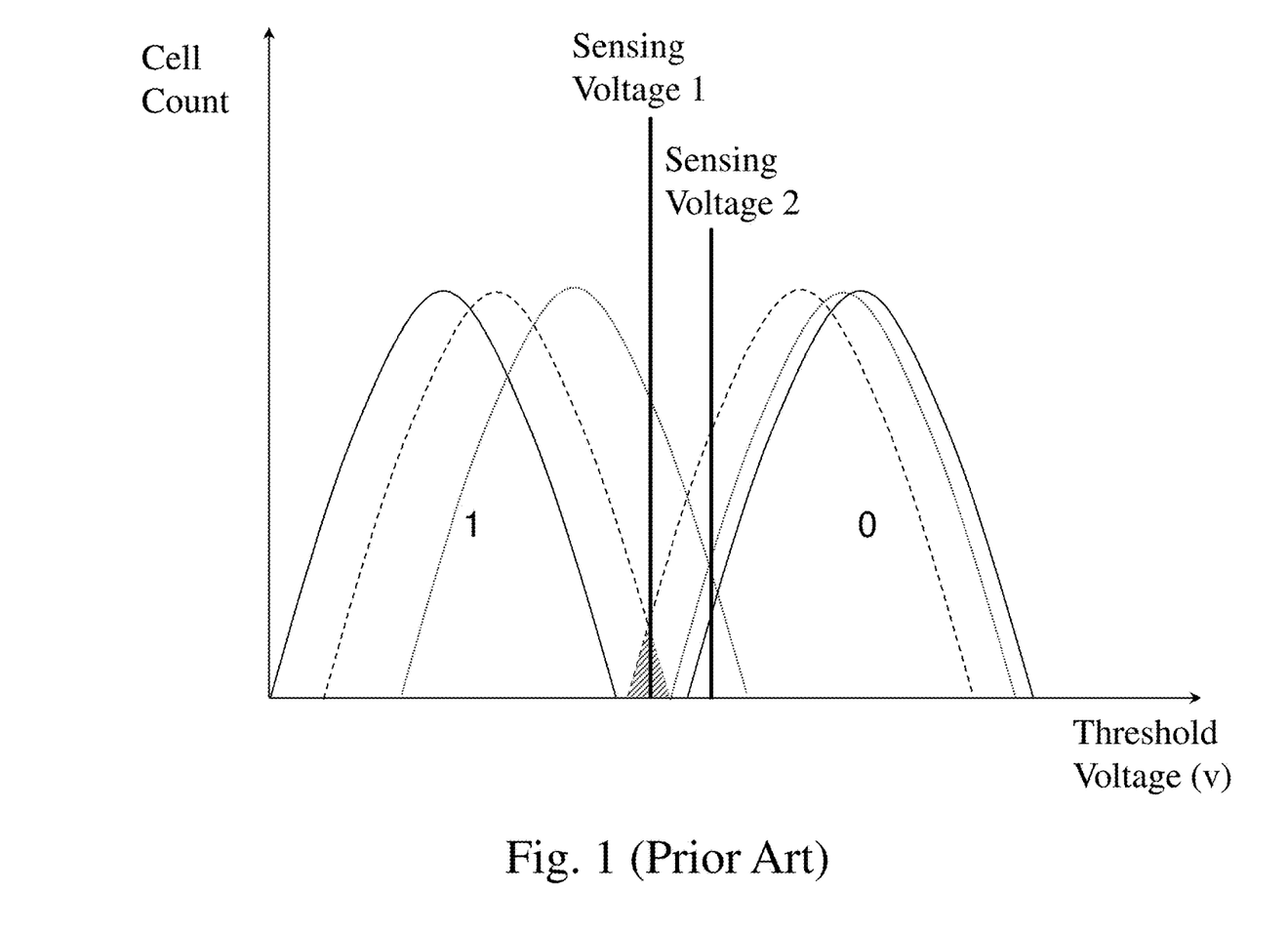
FIG. 1 shows a chart of distribution of threshold voltages of a flash memory.

Please refer to FIG. 1. It shows a chart of distribution of threshold voltages of a flash memory. Ideally, when a sensing voltage 1 is applied, some cells having threshold voltages lower than it and recognized as logic 1 (the left solid distribution curve) while others having threshold voltages higher than it and recognized as logic 0 (programmed, the right solid distribution curve). However, a real situation would be like the two dashed distribution curves with an overlap (dashed area). The overlap means that the applied sensing voltage 1 will be used to tell some incorrect logic in some cells (the number of uncertain cells can be obtained by calculating the dashed area). It can be seen that the dashed interval is separated by a line indicating the sensing voltage 1. If the separation is made equally, namely, the one on the left of the line has the same size as that on the right of the line, a precise sensing voltage for the best soft-decision data could be available for ECC operation. This is a commonly used technique for the mentioned requirement. After a period of time in use, the threshold voltage distribution curves of the cells may vary, for example, changing to dot distribution curves in FIG. 1. If the sensing voltage 1 is still used, the best soft-decision data for ECC operation cannot be obtained. In FIG. 1, it is known that the precise sensing voltage for the changed condition is a sensing voltage 2. However, since the threshold voltage distribution curves of the cells change from time to time, it is hard to dynamically catch the sensing voltage 2. There are few studies on this issue as well.

Hence, an innovative method and system for determining bit values soft-decision data in a non-volatile memory is desired. Meanwhile, a precise sensing voltage applied thereby can be found out.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In order to fulfill the requirements above, a method for determining bit values in a non-volatile memory having a number of cells each for storing a bit value is disclosed. The method includes the steps of: a) providing a first test sensing voltage to the cells and calculating a cell count of cells which have threshold voltages higher than the first test sensing voltage; b) providing another test sensing voltage to the cells and calculating a difference of the cell counts between this step and previous step; c) providing still another test sensing voltage higher than the highest test sensing voltage in previous steps if the difference of the cell counts in step b is positive, or lower than the lowest test sensing voltage in previous steps if the difference of the cell counts in step b is negative and calculating another difference of the cell counts between this step and previous step; d) processing step c) for N times; e) calculating differential amounts of cell counts for adjacent two test sensing voltages and assigning an index number to each group of cells having threshold voltages fallen in the same adjacent two test sensing voltages, higher than the highest test sensing voltage and below the lowest test sensing voltage; f) choosing a voltage between the adjacent two test sensing voltages which cause the least differential amount in step e) as an updated sensing voltage; and g) determining bit values of cells as logic 1 with the corresponding index number when the threshold voltages of the cells are lower than the updated sensing voltage or as logic 0 with corresponding index number when the threshold voltages of the cells are higher than the updated sensing voltage.

The method further includes the steps of: h) checking if information based on the logic 1 and 0 from step g) is able to be decoded by an ECC decoding process; and i) if an answer of the step h) is no, choosing another voltage between the adjacent two test sensing voltages which cause the least differential amount in step e) as the updated sensing voltage.

Preferably, the bit values of cells have soft-decision data of stronger characteristic of logic 1 when the threshold voltages of the cells are lower and are below the updated sensing voltage and the bit values of cells have soft-decision data of stronger characteristic of logic 0 when the threshold voltages of the cells are higher and are over the updated sensing voltage. N is odd. The index numbers are given as LLR (Log-Likelihood Ratio) values.

Another method for determining bit values in a non-volatile memory having a number of cells each for storing a bit value is disclosed by the present invention. The method includes the steps of: a) providing a first test sensing voltage to the cells and calculating a cell count of cells which have threshold voltages lower than the first test sensing voltage; b) providing another test sensing voltage to the cells and calculating a difference of the cell counts between this step and previous step; c) providing still another test sensing voltage higher than the highest test sensing voltage in previous steps if the difference of the cell counts in step b is negative, or lower than the lowest test sensing voltage in previous steps if the difference of the cell counts in step b is positive and calculating another difference of the cell counts between this step and previous step; d) processing step c) for N times; e) calculating differential amounts of cell counts for adjacent two test sensing voltages and assigning an index number to each group of cells having threshold voltages fallen in the same adjacent two test sensing voltages, higher than the highest test sensing voltage and below the lowest test sensing voltage; f) choosing a voltage between the adjacent two test sensing voltages which cause the least differential amount in step e) as an updated sensing voltage; and g) determining bit values of cells as logic 1 with the corresponding index number when the threshold voltages of the cells are lower than the updated sensing voltage or as logic 0 with corresponding index number when the threshold voltages of the cells are higher than the updated sensing voltage.

The method further includes the steps of: h) checking if information based on the logic 1 and 0 from step g) is able to be decoded by an ECC decoding process; and i) if an answer of the step h) is no, choosing another voltage between the adjacent two test sensing voltages which cause the least differential amount in step e) as the updated sensing voltage.

Preferably, the bit values of cells have soft-decision data of stronger characteristic of logic 1 when the threshold voltages of the cells are lower and are below the updated sensing voltage and the bit values of cells have soft-decision data of stronger characteristic of logic 0 when the threshold voltages of the cells are higher and are over the updated sensing voltage. N is odd. The index numbers are given as LLR values.

A system for determining bit values in a non-volatile memory having a number of cells each for storing a bit value is also disclosed by the present invention. The system includes: a digital signal processing unit, for controlling sensing voltages provided to the cells to detect threshold voltages thereof when a read command is received, processing the method of one above and providing information stored in the cells with the index number; and an error correction code unit, for correcting error bits in the information and generating a correct message from the information.

The method further includes the steps of: h) checking if information based on the logic 1 and 0 from step e) is able to be decoded by an ECC decoding process; and i) if an answer of the step h) is no, choosing another voltage between the adjacent two test sensing voltages which cause the least differential amount in step e) as the updated sensing voltage.

Preferably, the bit values of cells have soft-decision data of stronger characteristic of logic 1 when the threshold voltages of the cells are lower and are below the updated sensing voltage and the bit values of cells have soft-decision data of stronger characteristic of logic 0 when the threshold voltages of the cells are higher and are over the updated sensing voltage. N is odd. The index numbers are given as LLR values.

By applying different test sensing voltages to detect threshold voltages of the cells, soft-decision data in the form of index numbers can be provided for further ECC decoding. Meanwhile, a precise sensing voltage can be found out. The above requirements can be fulfilled.

DETAILED DESCRIPTION OF THE PREFERRED EMBODIMENTS

The present invention will now be described more specifically with reference to the following embodiments.

Figure 2:
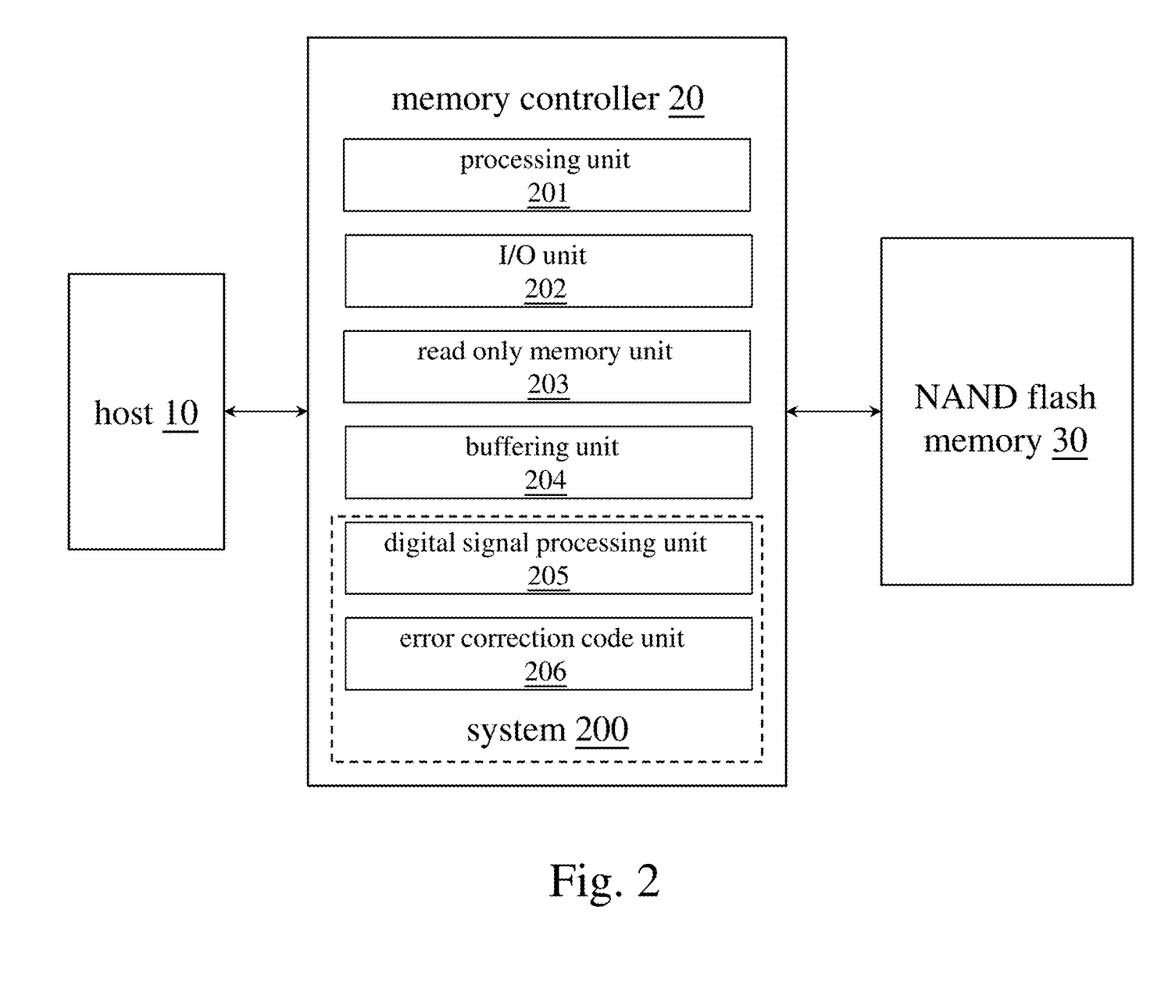
FIG. 2 is a block diagram showing architecture of an electronic device.

Please refer to FIG. 2. It is a block diagram showing architecture of an electronic device. The electronic device needs functions of data storage. Thus, the electronic device may be a smartphone, a tablet, a digital camera, or even a portable storage device (pen drive). The electronic device in general has several key parts: a host 10, a memory controller 20 and a NAND flash memory 30. The host 10 is in charge of operation of feature functions of the electronic device, e.g. picture taking for a digital camera. The host 10 generates lots of data to be stored in the NAND flash memory 30 and reads data therefrom. The memory controller 20, including a system 200 for determining bit values in a non-volatile memory which has a number of cells, is used as a tool to bridging data flow between the host 10 and the NAND flash memory 30. The NAND flash memory 30 includes a huge number of cells that each is for storing a bit value, logic 1 or logic 0. A certain number cells arranged in a page. Several pages form a block. Blocks are the basic unit to erase data for re-write and page is the basic unit to process writing. For illustration, in this embodiment, the NAND flash memory 30 is a SLC (Single-Level Cell) NAND flash memory.

The memory controller 20 has a processing unit 201, an I/O unit 202, a read only memory unit 203, a buffering unit 204, a digital signal processing unit (hereinafter, DSP unit is used to simply description) 205 and an error correction code unit (hereinafter, ECC unit is used to simply description) 206. The processing unit 201 is the key element in the memory controller 20. It can control and co-ordinate operations of all other elements in the memory controller 20 so that read and write commends from the host 10 can be fulfilled. It can also control sensing voltages provided to the cell in the NAND flash memory 30 to fetch the state of the cells. The I/O unit 202 is in charge of data transmitted between the host 10 and the NAND flash memory 30. The data in the form of bit 1s and 0s. The read only memory unit 203 keeps necessary firmware to adjust operation of the memory controller 20 for the processing unit 201. The buffering unit 204 is used to temporarily store data read from the NAND flash memory 30. The data may contain flipped bits and need to process ECC decoding before sent out to the host 10 through the I/O unit 202. In practice, it can be a RAM (Random Access Memory) module.

According to the present invention, the system 200 for determining bit values in a non-volatile memory having a number of cells each for storing a bit value, comprises the DSP unit 205 and the ECC unit 206. From another aspect, the DSP unit 205 and the ECC unit 206 are embedded in the memory controller 20 because one integrated chip can include the whole features the present invention disclosed. However, the system 200 can also be a separated module, assisting bit values identified and ECC decoding for an existing memory controller. It is not limited by the present invention.

Figure 3:
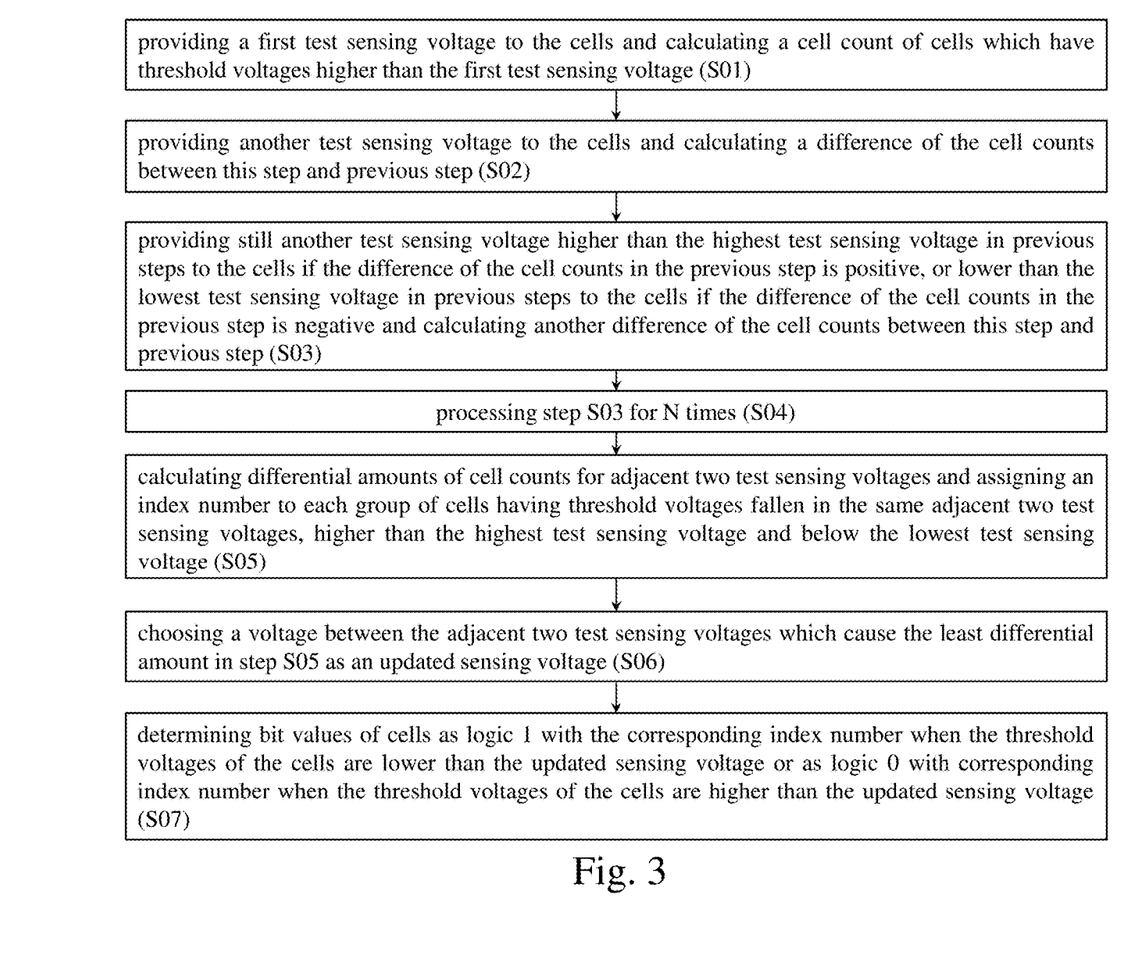
FIG. 3 is a flow chart of a method provided by the present invention.
Figure 4:
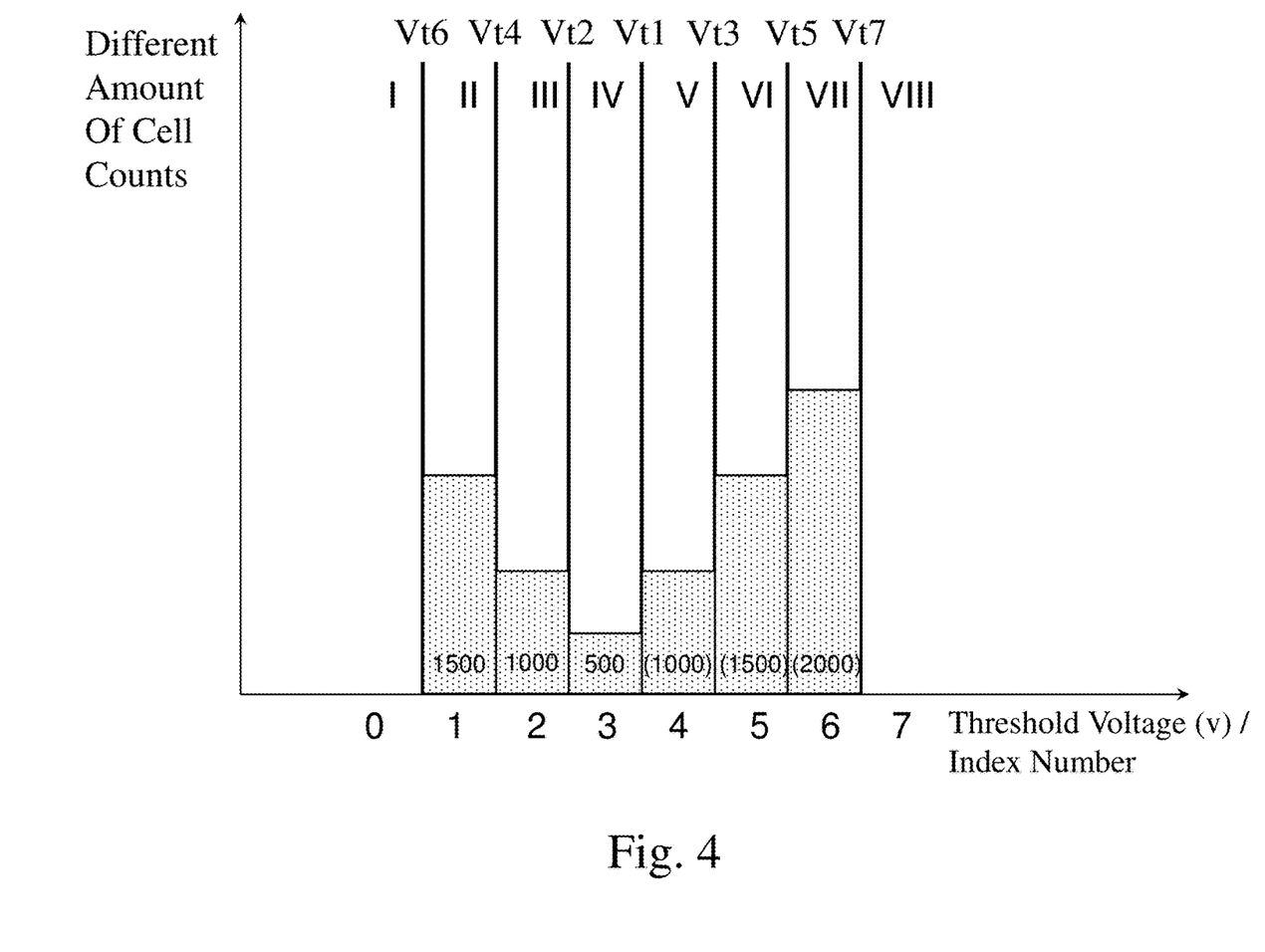
FIG. 4, FIG. 5 and FIG. 6 illustrate examples showing how sensing voltages are provided to determine logic 1 and logic 0 in the cells of the NAND flash memory.

The DSP unit 205 can control sensing voltages provided by the memory controller 20 to the cells to detect threshold voltages of the cells when a read command is received form the host 10. It can also process a bit-value determining procedure. Furthermore, the DSP unit 205 can provide information stored in the cells with an index number from the bit-value determining procedure. The bit-value determining procedure is a method disclosed by the present invention. In order to have a better understanding of the method, please refer to FIG. 3 and FIG. 4. FIG. 3 is a flow chart of the method and FIG. 4 illustrates how sensing voltages are provided to determine logic 1 and logic 0 in the cells of the NAND flash memory 30.

A first step of the method is providing a first test sensing voltage to the cells and calculating a cell count of cells which have threshold voltages higher than the first test sensing voltage (S01). As shown in FIG. 4, the first test sensing voltage just provided is marked as Vt1. As mentioned above, each cell may have different threshold voltage than others. Thus, when Vt1 is applied, each cell will response a status of its threshold voltage, higher or lower than the first test sensing voltage. According to S01, only the ones having threshold voltages higher than the first test sensing voltage are counted. For example, the number of the cell count may be 70,000. The cells under this condition are defined in a state of logic 0. The state of logic 0 means a cell has been programmed while a status of logic 1 means the cell has not been programmed. Each cell may have different threshold voltage than others also due to differences in manufacturing. In addition, the extent of hot electron injection plays an important role. The Vt1 can uses the default sensing voltage when the NAND flash memory 30 was made. Vt1 roughly separates the cells of logic 1 with higher threshold voltages from that of logic 0 with lower threshold voltages although, in fact, some of them are flipped if a real sensing voltage is shifted from Vt1. When the method is applied, the NAND flash memory 30 in the embodiment has cells of roughly equal logic 1 and logic 0 and all the pages must be used (written) for several times. At least, all the pages should be used once. It is a premise of the method to be applied. Preferably, the NAND flash memory 30 has been processed wear leveling for a couple of cycles and meets an aging condition.

A second step of the method is providing another test sensing voltage to the cells and calculating a difference of the cell counts between this step and previous step (S02). Although Vt1 may not be the real sensing voltage to equally separate cells of logic 1 and logic 0, there must be a larger number changed from logic 1 to logic 0 when a second test sensing voltage, denoted as Vt2, is given. In this embodiment, Vt2 is lower than Vt1. Area marked with dots between lines indicating Vt1 and Vt2 represents a differential amount between the cell counts obtained when Vt1 was applied and that obtained when Vt2 was applied. It is an positive value. However, difference of cell counts in step S02 refers to a value obtained by subtracting the former from the latter. Thus, the difference of cell counts may be positive or negative. A positive difference of cell counts means the number of the cell count increases when Vt2 was applied. More cells are identified as logic 0. On the contrary, a negative difference of cell counts means the number of the cell count decreases. Fewer cells are identified as logic 0. In FIG. 4, the difference of cell counts between Vt1 and Vt2 is +500. The differential amount is therefore 500. For any two adjacent two test sensing voltages mentioned below, a differential amount of the cell counts caused is denoted in the dotted area with a number. If the differential amount is negative, the number is denoted with a pair of parentheses.

Figure 5:
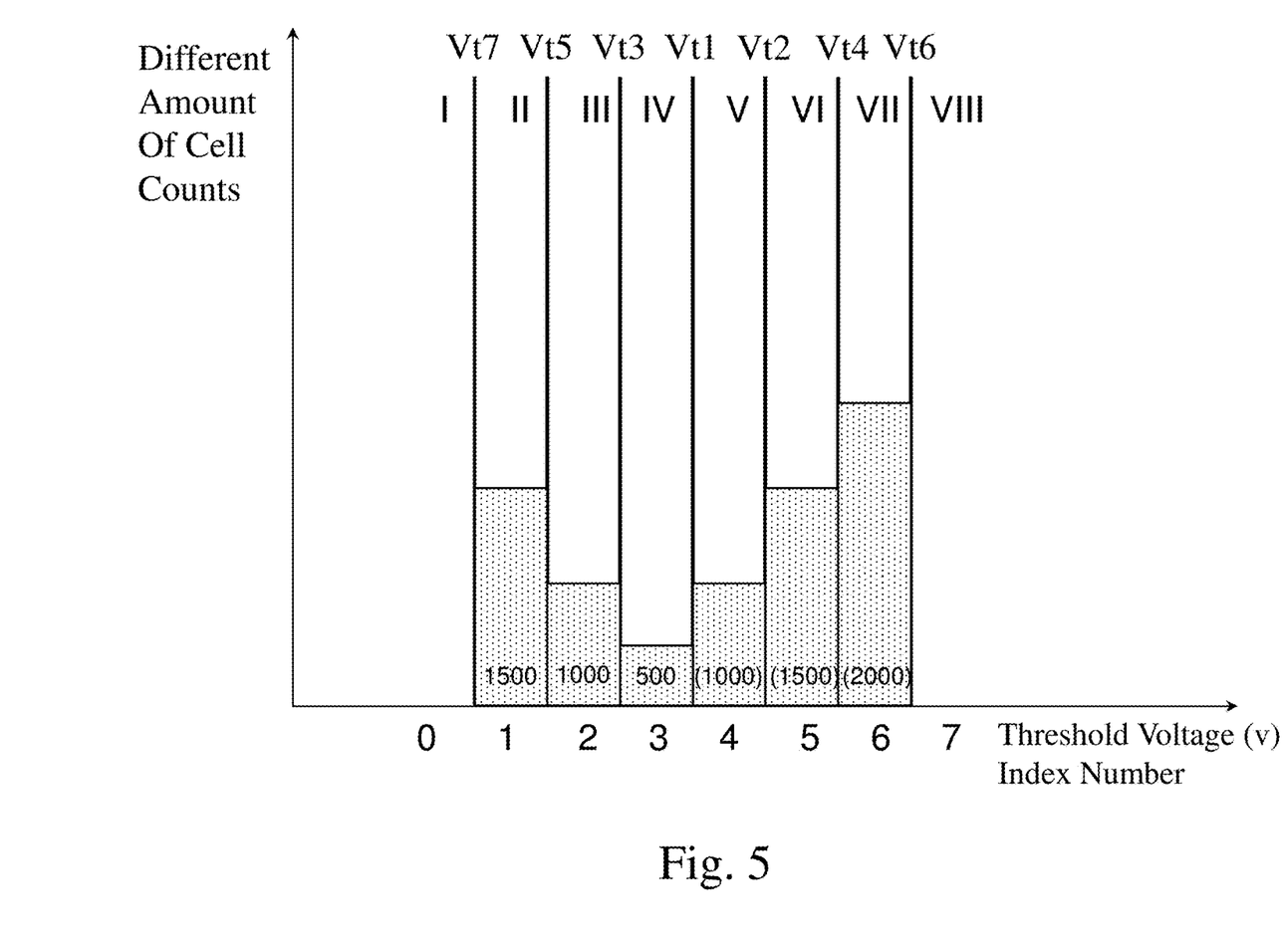

Next, according to the present invention, a step is providing still another test sensing voltage higher than the highest test sensing voltage in previous steps to the cells if the difference of the cell counts in the previous step is positive, or lower than the lowest test sensing voltage in previous steps to the cells if the difference of the cell counts in the previous step is negative and calculating another difference of the cell counts between this step and previous step (S03). In FIG. 4, a third test sensing voltage, denoted as Vt3, is provided. Vt3 is higher than the highest test sensing voltage, Vt1, since the difference from the step S02 is positive. Otherwise, in other embodiment, it will look like what happened in FIG. 5. In FIG. 5, the difference of cell counts caused by Vt2 and Vt1 is negative (−1000). Thus, Vt3 becomes lower than the lowest test sensing voltage, Vt1. Now, another difference of cell counts is available. The new difference of cell counts (a cell count when Vt3 was applied minuses the cell count when Vt2 was applied; in practice, only difference of cell counts can be available) can be calculated and is −1500. It should be noticed that since a second difference of cell counts is available, the differential amount between Vt1 and Vt3 can therefore be obtained. It is −1000 and calculated from −1500+500 (new difference of cell counts+previously calculated differential amount).

Next, process step S03 for N times (S04). Including Vt1 used in step S01 and Vt2 used in S02, there are N+2 test sensing voltages used to process one read operation. The number of test sensing voltages is to group cells of logic 1 and cells of logic 0, respectively. The number of groups of the cells of logic 1 is equal to that of the cells of logic 0. Thus, N+2 should be odd. Namely, N is odd. For example, N is 5 in the present invention. There are 7 test sensing voltages (Vt1, Vt2, Vt3, Vt4, Vt5, Vt6 and Vt7 in sequence) applied and step S03 is repeated for 5 times. When the second time step S03 is applied, Vt4 is lower than the lowest test sensing voltage, Vt2, since the difference of cell counts is negative when the step was first applied. The test sensing voltages are given in a way to two extremes interchangeably, i.e. Vt6<Vt4<Vt2 while Vt3<Vt5<Vt7. If there were two more test sensing voltages, Vt8 and Vt9, then Vt8 would be lower than Vt6 and Vt9 would be larger than Vt7. In other embodiments, the sequence may be changed. Vt2 and Vt3 may touch the two extremes and other test sensing voltages interchangeably fall within two extremes, for example, Vt2<Vt4<Vt6<Vt1<Vt7<Vt5<Vt3. It should be noticed that a difference between any two adjacent test sensing voltages is the same in this embodiment, e.g. 0.05V. In other embodiments, the differences may vary and are not a fixed value.

A fifth step of the method is calculating differential amounts of cell counts for adjacent two test sensing voltages and assigning an index number to each group of cells having threshold voltages fallen in the same adjacent two test sensing voltages, higher than the highest test sensing voltage and below the lowest test sensing voltage (SO5). As shown in FIG. 4, the groups of cells are given index numbers from 0 to 7 as threshold voltages increase. In this embodiment, the sequence of index numbers is in an ascending order. In other embodiment, the order may be descending. The integer number may not successive, e.g. 0, 2, 4, 6, 8, 10, 12 and 14, may be negative, e.g. −8, −6, −4, −2, 0, 2, 4 and 6, or even may be random, e.g. 4, 7, 5, 6, 1, 3, 2 and 0. The index numbers are used to describe how possible a bit value is logic 1 or logic 0. In other words, the index numbers are used as soft-decision data for determining one bit value.

A sixth step of the method is choosing a voltage between the adjacent two test sensing voltages which cause the least differential amount in step S05 as an updated sensing voltage (S06). Take FIG. 4 as an example. The least differential amount occurred between Vt1 and Vt2. If Vt1 is 1.65V and Vt2 is 1.70V, thus, one of 1.65V, 1.66V, 1.67V, 1.68V, 1.69V and 1.70V can be chosen as the updated sensing voltage. If allowed, a voltage has a value in the third decimal, e.g. 1.688V, or even lower can be used.

The last step of the method is determining bit values of cells as logic 1 with the corresponding index number when the threshold voltages of the cells are lower than the updated sensing voltage or as logic 0 with corresponding index number when the threshold voltages of the cells are higher than the updated sensing voltage (S07). As mentioned above, take the updated sensing voltage as Vt1 in this embodiment, the cells referred by interval I are logic 1 with soft-decision data of index number 0, the cells referred by interval II are logic 1 with soft-decision data of index number 1, the cells referred by interval III are logic 1 with soft-decision data of index number 2, the cells referred by interval IV are logic 1 with soft-decision data of index number 3, the cells referred by interval V are logic 0 with soft-decision data of index number 4, the cells referred by interval VI are logic 0 with soft-decision data of index number 5, the cells referred by interval VII are logic 0 with soft-decision data of index number 6, and the cells referred by interval VIII are logic 0 with soft-decision data of index number 7. The soft-decision data are provided for ECC decoding, such as LDPC (Low Density Parity Check) decoding.

In one example, the bit values of cells have soft-decision data of stronger characteristic of logic 1 when the threshold voltages of the cells are lower and are below the updated sensing voltage. If cells have the threshold voltages equal to the updated sensing voltage (it means cells are hard to identify as logic 1 or logic 0 by their threshold voltage when the updated sensing voltage is applied; they may have chances to be logic 1 or logic 0, e.g. 50% logic 1 and 50% logic 0), bit values of the cells can be chosen to 1 or 0 depending on an ECC decoding result. That means cells come with index number 0 have the strongest characteristic of logic 1 (can be determined as logic 1 without doubt). Cells with index number 1 have the second strongest characteristic of logic 1 (can be determined as logic 1 with very low possibility to be logic 0 after ECC decoding). Cells with index number 2 have the second weakest characteristic of logic 1 (can be determined as logic 1 with low possibility to be logic 0 after ECC decoding). Cells with index number 3 have the weakest characteristic of logic 1 (can be determined as logic 1 with higher possibility to be logic 0 after ECC decoding). Similarly, in the other example, the bit values of cells have soft-decision data of stronger characteristic of logic 0 when the threshold voltages of the cells are higher and are over the updated sensing voltage. Namely, cells with index number 4 have the weakest characteristic of logic 0 (can be determined as logic 0 with higher possibility to be logic 1 after ECC decoding), cells with index number 5 have the second weakest characteristic of logic 0 (can be determined as logic 0 with low possibility to be logic 1 after ECC decoding), cells with index number 6 have the second strongest characteristic of logic 0 (can be determined as logic 0 with very low possibility to be logic 1 after ECC decoding) and cells with index number 7 have the strongest characteristic of logic 0 (can be determined as logic 0 without doubt). Preferably, the index numbers are given as LLR (Log-Likelihood Ratio) values.

If two pairs of adjacent two sensing voltages have the same differential amounts, any voltage between the highest and the lowest sensing voltages can be chosen as the updated sensing voltage. For example, if interval IV and interval V both have the same differential amounts, 500, any voltage between Vt2 and Vt3 can be chosen as the updated sensing voltage.

Here, the updated sensing voltage may be a precise sensing voltage to define logic 1 and logic 0 and will be the first test sensing voltage for a later read operation. The method will be used once when one read command is received. For consequent reads, the precise sensing voltage may not change since physical conditions of all cells are not changed in a short time. However, when the method is first applied, the first test sensing voltage may not be available. It is only to follow a reference provided by the manufacturer when the NAND flash memory 30 was produced. Under this situation, the first sensing voltage shifts. More cells will be determined as logic 0 or logic 1 though they might not be. For this, two more steps may be required.

A step follows the step S07 is checking if information based on the logic 1 and 0 from step S07 is able to be decoded by an ECC decoding process (S08). The ECC decoding process is carried by the error correction code unit 206. Then, if an answer of the step S08 is no, choose another voltage between the adjacent two test sensing voltages which cause the least differential amount in step S05 as the updated sensing voltage (S08). Anyway, the updated sensing voltage does exist between two adjacent two test sensing voltages that bring the least differential amount.

Figure 6:
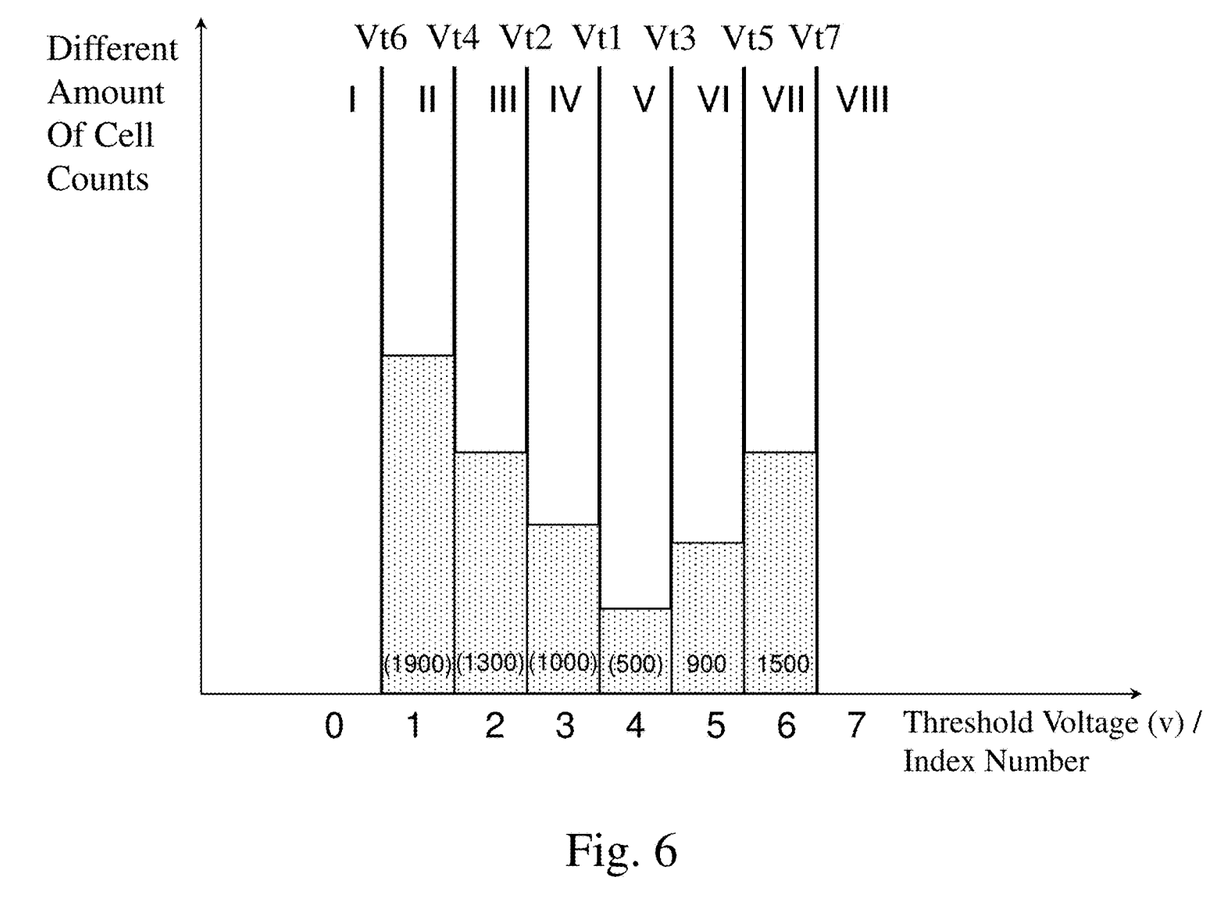

In other embodiment, the cell count in step S01 can be of cells having threshold voltages higher than the first test sensing voltage, rather than lower. The difference from the previous embodiment is the step S03. Step 03 will be changed to "providing still another test sensing voltage higher than the highest test sensing voltage in previous steps to the cells if the difference of the cell counts in the previous step is negative, or lower than the lowest test sensing voltage in previous steps to the cells if the difference of the cell counts in the previous step is positive and calculating another difference of the cell counts between this step and previous step". Except step S01 and S03, other steps are unchanged. For a better understanding, please refer to FIG. 6. It is obvious that when the test sensing voltage is lower than possible updated sensing voltages (voltages between Vt1 and Vt3), the differential amount between any two adjacent two test sensing voltages is negative, rather than positive as FIG. 4 and FIG. 5 show.

The ECC unit 206 is for correcting error bits in the information and generating a correct message from the information. In this embodiment, if soft-decision data are used, the ECC decoding algorism can be LDPC. However, according to the present invention, hard-decision data can be applied, too. Thus, the DSP unit 205 sends results of logic 1 and logic 0 without the index numbers. The ECC decoding algorism is better BCH. For soft-decision or hard-decision data, the ECC unit 206 should be designed with a soft decoder or a hard decoder to deal with.

It should be emphasized that although the system 200 in the embodiment works for SLC NAND flash memory 30, it can be applied to other types, such as Multi-Level Cell (MLC) and Triple-Level Cell (TLC), of NAND flash memory. Since one cell has status of 2 or 3 bits with several sensing voltages, the method provided by the present invention is used to determine logic 1 or 0 from the most significant bit to the least significant bit for all cells in different turns. In addition, according to the present invention, the system 200 can be applied to other non-volatile memory. Namely, a NOR flash memory can be used instead of the NAND flash memory 30.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A method for determining bit values in a non-volatile memory having a plurality of cells each for storing a bit value, comprising the steps of:
    a) providing a first test sensing voltage to the cells and calculating a cell count of cells which have threshold voltages higher than the first test sensing voltage;
    b) providing another test sensing voltage to the cells and calculating a difference of the cell counts between this step and previous step;
    c) providing still another test sensing voltage higher than the highest test sensing voltage in previous steps to the cells if the difference of the cell counts in the previous step is positive, or lower than the lowest test sensing voltage in previous steps to the cells if the difference of the cell counts in the previous step is negative and calculating another difference of the cell counts between this step and previous step;
    d) processing step c) for N times;
    e) calculating differential amounts of cell counts for adjacent two test sensing voltages and assigning an index number to each group of cells having threshold voltages fallen in the same adjacent two test sensing voltages, higher than the highest test sensing voltage or below the lowest test sensing voltage;
    f) choosing a voltage between the adjacent two test sensing voltages which cause the least differential amount in step e) as an updated sensing voltage; and
    g) determining bit values of cells as logic 1 with the corresponding index number when the threshold voltages of the cells are lower than the updated sensing voltage or as logic 0 with corresponding index number when the threshold voltages of the cells are higher than the updated sensing voltage.

2. The method according to claim 1, further comprising the steps of:
    h) checking if information based on the logic 1 and 0 from step g) is able to be decoded by an ECC decoding process; and
    i) if an answer of the step h) is no, choosing another voltage between the adjacent two test sensing voltages which cause the least differential amount in step e) as the updated sensing voltage.

3. The method according to claim 1, wherein the bit values of cells have soft-decision data of stronger characteristic of logic 1 when the threshold voltages of the cells are lower and are below the updated sensing voltage and the bit values of cells have soft-decision data of stronger characteristic of logic 0 when the threshold voltages of the cells are higher and are over the updated sensing voltage.

4. The method according to claim 1, wherein N is odd.

5. The method according to claim 1, wherein the index numbers are given as LLR (Log-Likelihood Ratio) values.

6. A method for determining bit values in a non-volatile memory having a plurality of cells each for storing a bit value, comprising the steps of:
    a) providing a first test sensing voltage to the cells and calculating a cell count of cells which have threshold voltages lower than the first test sensing voltage;
    b) providing another test sensing voltage to the cells and calculating a difference of the cell counts between this step and previous step;
    c) providing still another test sensing voltage higher than the highest test sensing voltage in previous steps to the cells if the difference of the cell counts in the previous step is negative, or lower than the lowest test sensing voltage in previous steps to the cells if the difference of the cell counts in the previous step is positive and calculating another difference of the cell counts between this step and previous step;
    d) processing step c) for N times;
    e) calculating differential amounts of cell counts for adjacent two test sensing voltages and assigning an index number to each group of cells having threshold voltages fallen in the same adjacent two test sensing voltages, higher than the highest test sensing voltage or below the lowest test sensing voltage;
    f) choosing a voltage between the adjacent two test sensing voltages which cause the least differential amount in step e) as an updated sensing voltage; and
    g) determining bit values of cells as logic 1 with the corresponding index number when the threshold voltages of the cells are lower than the updated sensing voltage or as logic 0 with corresponding index number when the threshold voltages of the cells are higher than the updated sensing voltage.

7. The method according to claim 6, further comprising the steps of:
    h) checking if information based on the logic 1 and 0 from step g) is able to be decoded by an ECC decoding process; and
    i) if an answer of the step h) is no, choosing another voltage between the adjacent two test sensing voltages which cause the least differential amount in step e) as the updated sensing voltage.

8. The method according to claim 6, wherein the bit values of cells have soft-decision data of stronger characteristic of logic 1 when the threshold voltages of the cells are lower and are below the updated sensing voltage and the bit values of cells have soft-decision data of stronger characteristic of logic 0 when the threshold voltages of the cells are higher and are over the updated sensing voltage.

9. The method according to claim 6, wherein N is odd.

10. The method according to claim 6, wherein the index numbers are given as LLR values.

11. A system for determining bit values in a non-volatile memory having a plurality of cells each for storing a bit value, comprising:
    a digital signal processing unit, for controlling sensing voltages provided to the cells to detect threshold voltages thereof when a read command is received, processing the method according to claim 1 and providing information stored in the cells with the index number; and an error correction code unit, for correcting error bits in the information and generating a correct message from the information.

12. The system according to claim 11, wherein the method further comprises the steps of:
  h) checking if information based on the logic 1 and 0 from step g) is able to be decoded by an ECC decoding process; and
  i) if an answer of the step h) is no, choosing another voltage between the adjacent two test sensing voltages which cause the least differential amount in step e) as the updated sensing voltage.

13. The system according to claim 11, wherein the bit values of cells have soft-decision data of stronger characteristic of logic 1 when the threshold voltages of the cells are lower and are below the updated sensing voltage and the bit values of cells have soft-decision data of stronger characteristic of logic 0 when the threshold voltages of the cells are higher and are over the updated sensing voltage.

14. The system according to claim 11, wherein N is odd.

15. The system according to claim 11, wherein the index numbers are given as LLR values.

16. A system for determining bit values in a non-volatile memory having a plurality of cells each for storing a bit value, comprising:

a digital signal processing unit, for controlling sensing voltages provided to the cells to detect threshold voltages thereof when a read command is received, processing the method according to claim 6 and providing information stored in the cells with the index number; and an error correction code unit, for correcting error bits in the information and generating a correct message from the information.

17. The system according to claim 16, wherein the method further comprises the steps of:
  h) checking if information based on the logic 1 and 0 from step g) is able to be decoded by an ECC decoding process; and
  i) if an answer of the step h) is no, choosing another voltage between the adjacent two test sensing voltages which cause the least differential amount in step e) as the updated sensing voltage.

18. The system according to claim 16, wherein the bit values of cells have soft-decision data of stronger characteristic of logic 1 when the threshold voltages of the cells are lower and are below the updated sensing voltage and the bit values of cells have soft-decision data of stronger characteristic of logic 0 when the threshold voltages of the cells are higher and are over the updated sensing voltage.

19. The system according to claim 16, wherein N is odd.

20. The system according to claim 16, wherein the index numbers are given as LLR values.

\* \* \* \* \*